United States Patent
Gomm et al.

(10) Patent No.: US 7,212,053 B2
(45) Date of Patent: May 1, 2007

(54) MEASURE-INITIALIZED DELAY LOCKED LOOP WITH LIVE MEASUREMENT

(75) Inventors: Tyler Gomm, Meridian, ID (US); Greg Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 11/127,456

(22) Filed: May 12, 2005

(65) Prior Publication Data

US 2006/0255843 A1    Nov. 16, 2006

(51) Int. Cl.
 *H03L 7/06* (2006.01)
(52) U.S. Cl. .................................. 327/158; 327/149
(58) Field of Classification Search ................ 327/147, 327/149, 152, 153, 156, 158, 161
See application file for complete search history.

(56) References Cited

U.S. PATENT DOCUMENTS

| | | | | |
|---|---|---|---|---|
| 5,822,387 A | 10/1998 | Mar | ............................ | 375/376 |
| 6,373,913 B1* | 4/2002 | Lee | ............................ | 375/376 |
| 6,396,322 B1* | 5/2002 | Kim et al. | ................... | 327/158 |
| 6,476,652 B1* | 11/2002 | Lee et al. | .................... | 327/158 |
| 6,489,823 B2* | 12/2002 | Iwamoto | ..................... | 327/158 |
| 6,549,041 B2* | 4/2003 | Waldrop | ........................ | 327/5 |
| 6,618,283 B2* | 9/2003 | Lin | ............................ | 365/200 |
| 6,768,690 B2 | 7/2004 | Kwon et al. | ................. | 365/194 |
| 6,801,472 B2 | 10/2004 | Lee | ............................ | 365/233 |
| 6,822,494 B2 | 11/2004 | Kim | ............................ | 327/160 |
| 6,930,525 B2* | 8/2005 | Lin et al. | ..................... | 327/161 |
| 7,076,012 B2* | 7/2006 | Dermott et al. | ............. | 375/354 |
| 7,145,374 B2* | 12/2006 | Lin et al. | .................... | 327/161 |
| 2003/0081473 A1 | 5/2003 | Lin | ............................ | 365/200 |
| 2003/0227305 A1 | 12/2003 | Mikhalev et al. | ........... | 327/141 |
| 2005/0041486 A1 | 2/2005 | Cooper | ....................... | 365/194 |

* cited by examiner

*Primary Examiner*—Timothy P. Callahan
*Assistant Examiner*—Hai L. Nguyen
(74) *Attorney, Agent, or Firm*—Jones Day; Edward L. Pencoske

(57) ABSTRACT

A method of operating a delay locked loop is comprised of producing a first output signal in response to a first lock point. A new lock point is measured, or otherwise determined, while continuing to produce the first output signal. Thereafter, a second output signal is produced in response to the new lock point. The new lock point data may be loaded into the delay locked loop while the delay locked loop continues to produce the first output signal. The delay locked loop switches from producing the first output signal, responsive to a first lock point, to producing the second output signal, responsive to the new lock point, in response to various conditions such as control signals, e.g. an auto refresh command, a precharge all command, a mode register load command, a power down entry, a power down exit (among others), in response to a timer, e.g., an internal timer (among others), or in response to environmental condition signals, e.g., a temperature sensor output signal (among others). Circuits and systems using the disclosed method are also disclosed. Because of the rules governing abstracts, this abstract should not be used to construe the claims.

18 Claims, 3 Drawing Sheets

MEASURE-INITIALIZED DELAY LOCKED LOOP WITH LIVE MEASUREMENT

BACKGROUND

1. Field of the Disclosure

The present disclosure generally relates to synchronous circuits and, more particularly, to a method and apparatus for initializing a delay locked loop (DLL).

2. Brief Description of Related Art

Most digital logic implemented on integrated circuits is clocked synchronous sequential logic. In electronic devices such as synchronous dynamic random access memory circuits (SDRAMs), microprocessors, digital signal processors, etc., the processing, storage, and retrieval of information is coordinated or synchronized with a clock signal. The speed and stability of the clock signal determines to a large extent the data rate at which a circuit can function. Many high speed integrated circuit devices, such as SDRAMs, microprocessors, etc., rely upon clock signals to control the flow of commands, data, addresses, etc., into, through and out of the devices.

In SDRAMs or other semiconductor memory devices, it is desirable to have the data output from the memory synchronized with the system clock that also serves the microprocessor. Delay locked loops (DLLs) are synchronous circuits used in SDRAMs to synchronize an external clock (e.g., the system clock serving a microprocessor) and an internal clock (e.g., the clock used internally within the SDRAM to perform data read/write operations on various memory cells) with each other. Typically, a DLL is a feedback circuit that operates to feed back a phase difference-related signal to control a delay line, until the timing of one clock signal (e.g., the system clock) is advanced or delayed until its rising edge is coincident (or "locked") with the rising edge of a second clock signal (e.g., the memory internal clock). A brief discussion of the operation of a DLL is provided hereinbelow with reference to FIG. 1.

Turning to FIG. 1, the delay of the forward delay path of a delay locked loop 10 is given by the equation:

$$d1 + [N^*tCK - (d1' + d2')] + d2 = N^*tCK$$

In FIG. 1, the clock-to-strobe time [(B)-to-(A)] is equal to $N^*tCK$. If the time from node (B) to (A) is $N^*tCK$, then the portion in the delay line is: $N^*tCK - (d1' + d2')$. That allows the DLL 10 to be initialized through inputting a measurement into the "broadside" of the shift register, i.e. a broadside measurement.

The current method of initializing the DLL 10 with a delay measurement (measure initialization) bypasses the DLL's forward delay line 12 through the operation of a multiplexer (MUX) 14 during DLL initialization. That ensures that the measurement is independent of the forward delay line 12 delay. However, anytime the forward delay line is bypassed, the clock propagating to the outputs may not be synchronized to the external clock.

During measurement time, the output clock timing is unknown (or at least, will not provide clock synchronization). Before causing the measurement strobe to fire, enough time must be allowed to ensure that the new, bypassed clock propagates fully through the I/O model 20 (d1'+d2') and into the measure delay line 18. That may take several clock cycles. As a result, the outputs cannot be synchronized anytime that a measurement is performed. If a new measurement is necessary, the outputs must not be used for several clock cycles.

Thus, a need exists for a DLL and method of operating a DLL that enables the old clock timing to continue to control the delay line until the new measurement is ready to control the delay line.

BRIEF SUMMARY OF THE DISCLOSURE

The present disclosure is directed, according to one embodiment, to a method of operating a delay locked loop. The method is comprised of producing a first output signal in response to a first lock point. A new lock point is measured, or otherwise determined, while continuing to produce the first output signal. A new lock point may be needed as a result of a change in temperature, supply voltage or clock frequency, among others. Thereafter, a second output signal is produced in response to the new lock point. The new lock point data may be loaded into the delay locked loop while the delay locked loop continues to produce the first output signal. The delay locked loop switches from producing the first output signal, responsive to a first lock point, to producing the second output signal, responsive to the new lock point, in response to, for example, control signals, e.g. an auto refresh command, a precharge all command, a mode register load command, a power down entry, a power down exit (among others), in response to a timer, e.g., an internal timer (among others), or in response to environmental condition signals, e.g., a temperature sensor output signal (among others).

The present disclosure is also directed to a delay locked loop comprising a forward delay line for receiving an input clock and for producing a synchronized output clock. An input/output model is responsive to the output clock. A phase detector is responsive to the input/output model and the input clock. A measure delay line is responsive to the input/output model. A latch/shift register is responsive to the measure delay line, the phase detector and is responsive to a first and a second independent strobe signals for producing a lock point control signal which is input to the forward delay line. The first and second independent strobe signals may be used to enable the latch/shift register to receive new lock point data and to cause the latch/shift register to output a lock point control signal based on the new lock point data, respectively. Memory devices and systems incorporating such a delay locked loop, and/or a method of operating such a delay locked loop are also disclosed.

The present disclosure allows a faster DLL reset in conditions where the external clock frequency has not changed, and the DLL has been previously locked, e.g. self-refresh exit. In cases where the system frequency is changing, e.g. clock frequency slewing, if the system is periodically updated with a new measurement, the DLL will be able to track much wider frequency ranges. Those, and other advantages and benefits, will be apparent from the description of the disclosure appearing hereinbelow.

BRIEF DESCRIPTION OF THE DRAWINGS

For the present disclosure to be easily understood and readily practiced, the present disclosure will now be described, for purposes of illustration and not limitation, in conjunction with the following figures, wherein.

DETAILED DESCRIPTION

Figure 2:
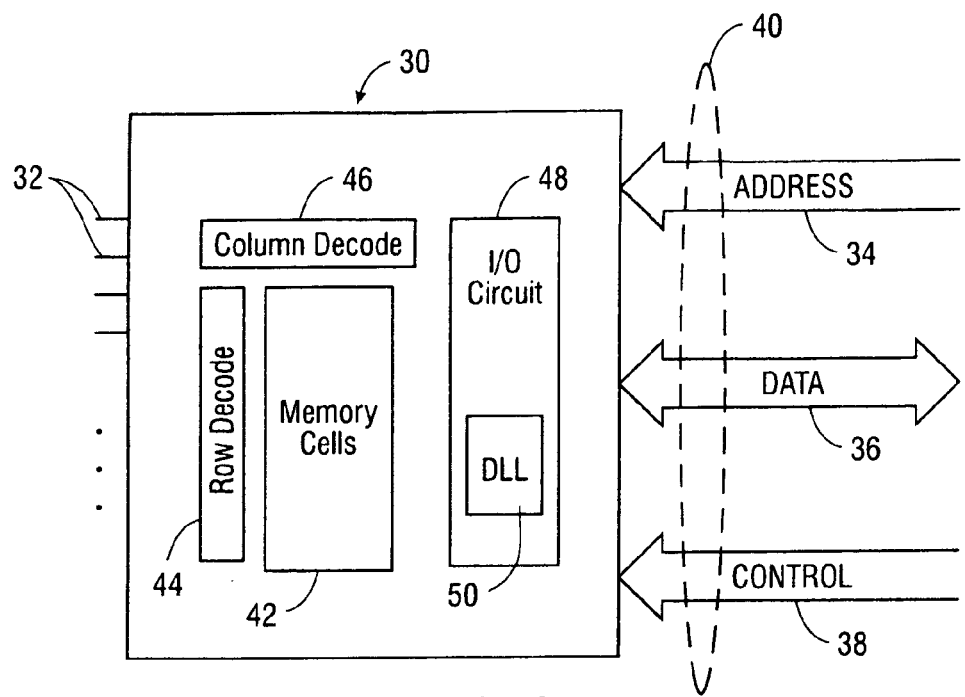
FIG. 2 is a block diagram of a memory chip constructed using the delay locked loop of the present disclosure.

FIG. 2 is a simplified block diagram showing a memory chip or memory device 30. The memory chip 30 may be part of a DIMM (dual in-line memory module) or a PCB (printed circuit board) containing many such memory chips (not shown in FIG. 2). The memory chip 30 may include a plurality of pins 32 located outside of chip 30 for electrically connecting the chip 30 to other system devices. Some of those pins 32 may constitute memory address pins or address bus 34, data pins or data bus 36, and control pins or control bus 38. It is evident that each of the reference numerals 34, 36, 38 designates more than one pin in the corresponding bus. Further, it is understood that the schematic in FIG. 2 is for illustration only. That is, the pin arrangement or configuration in a typical memory chip may not be in the form shown in FIG. 2.

A processor or memory controller (not shown) may communicate with the chip 30 and perform memory read/write operations. The processor and the memory chip 30 may communicate using address signals on the address lines or address bus 34, data signals on the data lines or data bus 36, and control signals (e.g., a row address strobe (RAS) signal, a column address strobe (CAS) signal, etc. (not shown)) on the control lines or control bus 38. The "width" (i.e., number of pins) of address, data and control buses may differ from one memory configuration to another. Additionally, in some circuit architectures, the bus 40 may be time multiplexed such that at one point in time the bus carries address information while at another point in time the same bus carry control signals, and at yet another point in time the same bus carries data signals.

Those of ordinary skill in the art will readily recognize that memory chip 30 of FIG. 2 is simplified to illustrate one embodiment of a memory chip and is not intended to be a detailed illustration of all of the features of a typical memory chip. Numerous peripheral devices or circuits may be provided within the memory chip 30 for writing data to and reading data from an array of memory cells 42. However, these peripheral devices or circuits are shown only generally in FIG. 2 for the sake of clarity as described below.

The memory chip 30 may include a plurality of memory cells generally arranged in rows and columns to form array 42 to store data. Each memory cell within array 42 may store one bit of data. A row decode circuit 44 and a column decode circuit 46 may select the rows and columns in the memory array 42 in response to decoding an address, provided on the address bus 34. Data to/from the array of memory cells 42 is transferred over the data bus 36 via sense amplifiers and a data output path (shown generally as I/O unit 48). A memory controller (not shown) may provide relevant control signals (not shown) on the control bus 38 to control data communication to and from the memory chip 30 via the I/O (input/output) unit 48. The I/O unit 48 may include a number of data output buffers to receive the data bits from the cells of the memory array 42 and provide those data bits or data signals to the corresponding data lines in the data bus 36. The I/O unit 48 may further include a clock synchronization unit or delay locked loop (DLL) 50 to synchronize an external system clock (e.g., the clock used by the memory controller (not shown in FIG. 2)) to clock address, data and control signals between the memory chip 30 and the controller.

The memory controller (not shown) may determine the modes of operation of memory chip 30. Some examples of the input signals or control signals (not shown in FIG. 2) on the control bus 38 include an external clock signal, a Chip Select signal, a Row Address Strobe signal, a Column Address Strobe signal, a Write Enable signal, etc. The memory chip 30 communicates to other devices connected thereto via the pins 32 on the chip 30. These pins, as mentioned before, may be connected to appropriate address, data and control lines to carry out data transfer (i.e., data transmission and reception) operations.

Figure 3:
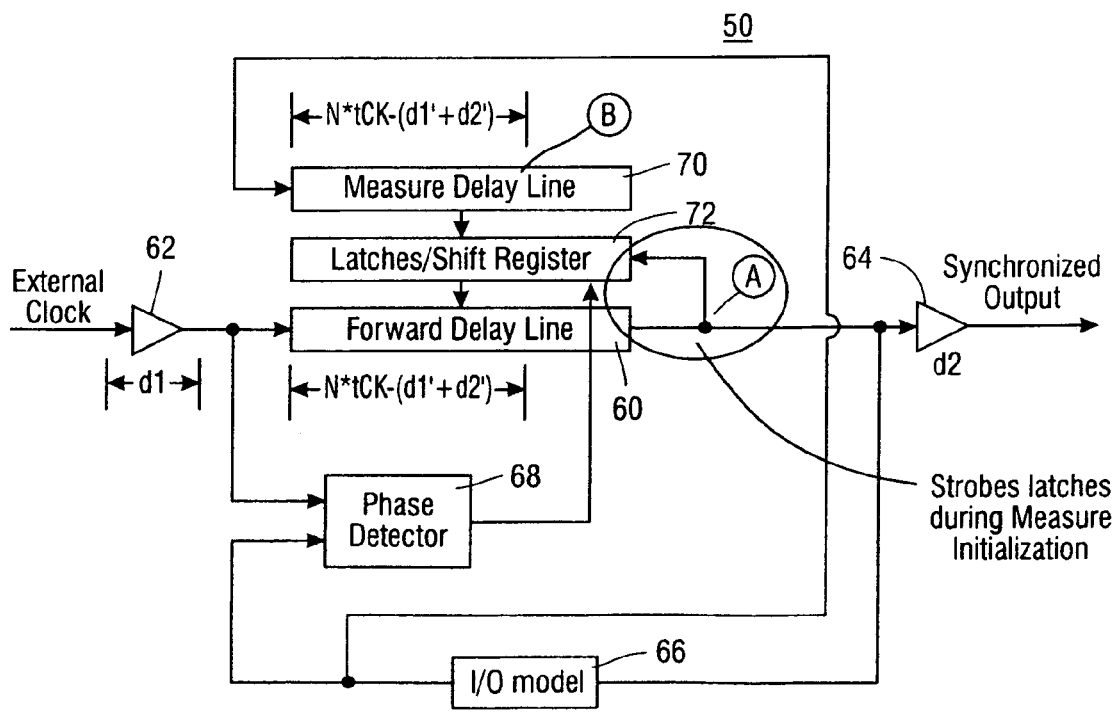
FIG. 3 is a block diagram of an embodiment of a delay locked loop constructed according to the present disclosure and suitable for use in the memory chip of FIG. 2.

FIG. 3 is a block diagram of one embodiment of a delay locked loop 50 constructed according to the present disclosure and suitable for use in the memory chip 30 of FIG. 2. In FIG. 3, a forward delay line 60 receives an external clock through an input buffer 62 and produces a synchronized output, which may be referred to as an internal clock, available at the output of an output delay/buffer 64. An I/O model 66 is responsive to the forward delay line 60. A phase detector 68 is responsive to both the I/O model 66 and the external clock available at the output of the buffer 62. A measure delay line 70 is responsive to the I/O model 66. A latch/shift register 72 is responsive to the measure delay line and the phase detector 68 for producing a lock point control signal which is input to the forward delay line 60. As is known in the art, the latches/shift register 72 receives a shift left/shift right or shift up/shift down signal from the phase detector 68.

The forward delay path for the DLL shown in FIG. 3 is:

$$D1+[N*tCK-(d1'+d2')]+d2=N*tCK$$

Figure 1:
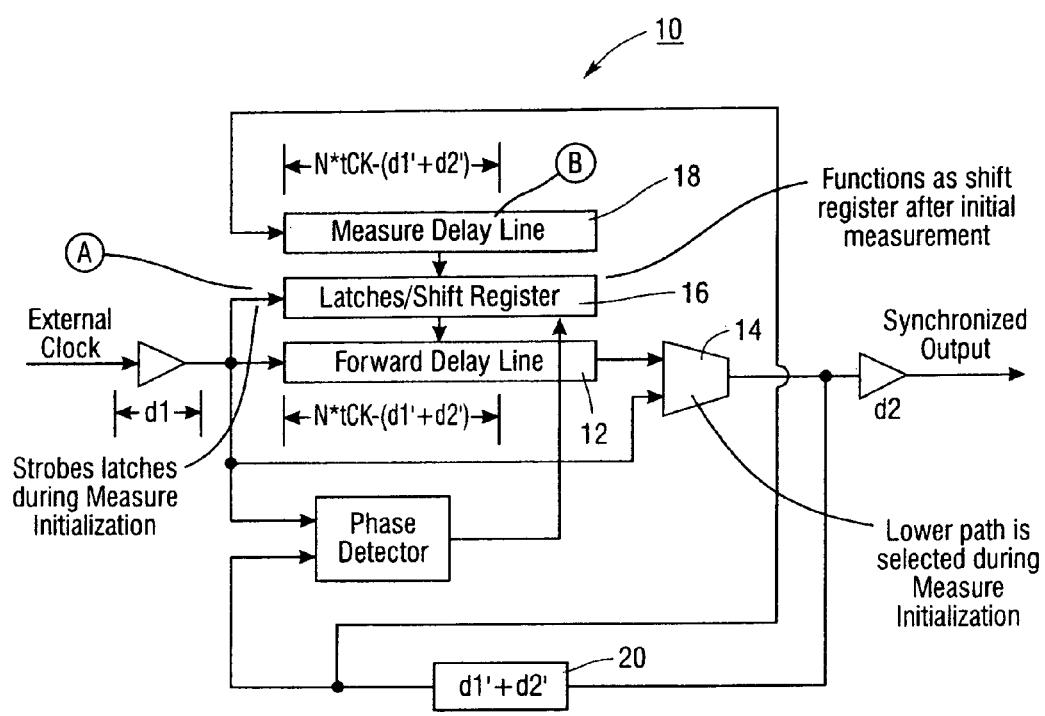
FIG. 1 is a block diagram of a prior art delay locked loop.

The clock to strobe time [(B)-to-(A)] is still equal to N*tCK as was the case with the prior art circuit shown in FIG. 1.

To allow the synchronized output available at the output of buffer 64 to retain the current delay line timing while at the same time performing a new broad-side measurement, the DLL 50 of FIG. 3 has moved the latch strobe to the output of the delay line 60. The timing from node (A) to (B) is still an exact multiple of tCK regardless of the current delay in the forward delay line.

Figure 4:
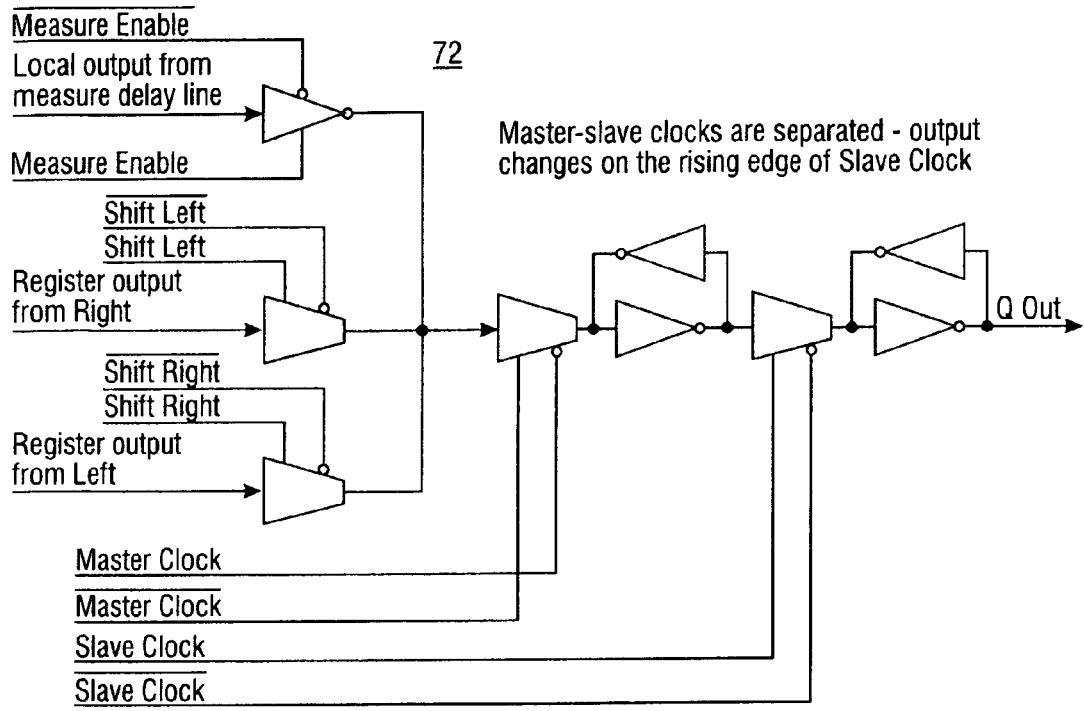
FIG. 4 is a circuit diagram of one embodiment of the latch/shift register of FIG. 3.

The latches in the latches/shift register 72 are modified as shown in FIG. 4 so that the control clock for the "master" and "slave" latches are separate and may be independent signals. That allows the master to be loaded with a new measurement without immediately affecting the output of the shift register 72. When the measurement is complete, the slave latches are triggered, causing the register to output a new lock point control signal to the forward delay line based on the new lock point. Note that when the register is used as a shift register, the separated control clocks are used as though they were the same clock, not necessarily to hold off changing the output of the register 72.

The circuit of FIG. 3 together with the modified latch of FIG. 4 will allow the DLL 50 to determine a new lock point due to frequency changes, temperature changes, voltage changes etc., after the DLL has been previously locked. Thus, according to a method of operating the delay locked loop 50 of FIG. 3, the internal clock may continue to be produced in response to a first lock point while a new lock point measurement is being taken. After the new lock point has been produced, either by measurement or calculation, the latch of FIG. 4 is strobed with the master clock to allow the new data to be input. Thereafter, and in response to, for example, control signals, e.g. an auto refresh command, a precharge all command, a mode register load command, a power down entry, a power down exit (among others), in response to a timer, e.g., an internal timer (among others), or in response to environmental condition signals, e.g., a temperature sensor output signal (among others), the circuit of FIG. 4 is strobed again to move the new data to the output of the latch/register 72. In cases where the system frequency is changing due to, for example, clock frequency slewing, if the DLL 50 is periodically updated with a new measurement for a new lock point, the DLL 50 will be able to track a much wider frequency range.

Figure 5:
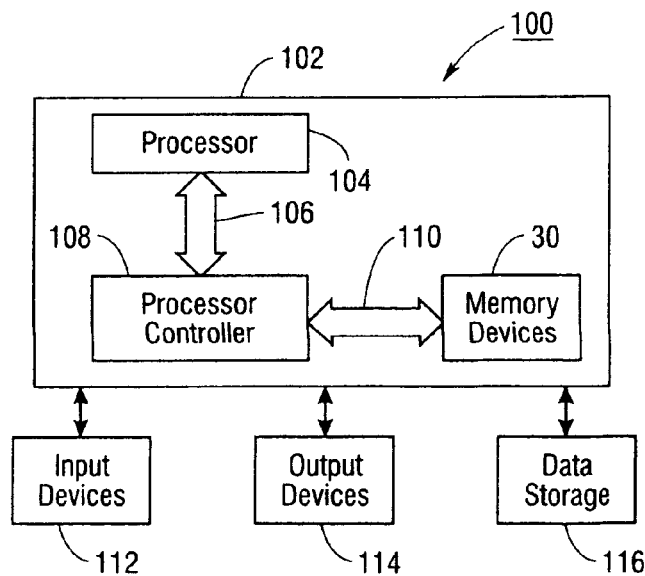
FIG. 5 is a system constructed using the memory chip of FIG. 2.

FIG. 5 is a block diagram depicting a system 100 in which one or more memory chips 30 illustrated in FIG. 2 may be used. The system 100 may include a data processing unit or computing unit 102 that includes a processor 104 for performing various computing functions, such as executing specific software to perform specific calculations or data processing tasks. The computing unit 102 also includes a memory controller 108 that is in communication with the processor 104 through a bus 106. The bus 106 may include an address bus (not shown), a data bus (not shown), and a control bus (not shown). The memory controller 108 is also in communication with a set of memory devices 30 (i.e., multiple memory chips 30 of the type shown in FIG. 2) through another bus 110 (which may be similar to the bus 40 shown in FIG. 2). Each memory device 30 may include appropriate data storage and retrieval circuitry (not shown in FIG. 5) as shown in FIG. 2. The processor 104 can perform a plurality of functions based on information and data stored in the memories 30.

The memory controller 108 can be a microprocessor, digital signal processor, embedded processor, micro-controller, dedicated memory test chip, a tester platform, or the like. The memory controller 108 may control routine data transfer operations to/from the memories 30, for example, when the memory devices 30 are part of an operational computing system 102. In one embodiment, the memory controller 108 may also provide appropriate system clocks (e.g., variable frequency clocks for power versus performance optimization) to the I/O circuit 48 (FIG. 2) so as to establish and maintain the lock conditions in the DLL 50 as per the teachings of the present disclosure. The memory controller 108 may reside on the same motherboard (not shown) as that carrying the memory chips 30. Various other configurations of electrical connection between the memory chips 30 and the memory controller 108 may be possible. For example, the memory controller 108 may be a remote entity communicating with the memory chips 30 via a data transfer or communications network (e.g., a LAN (local area network) of computing devices).

The system 100 may include one or more input devices 112 (e.g., a keyboard or a mouse) connected to the computing unit 102 to allow a user to manually input data, instructions, etc., to operate the computing unit 102. One or more output devices 114 connected to the computing unit 102 may also be provided as part of the system 100 to display or otherwise output data generated by the processor 104. Examples of output devices 114 include printers, video terminals or video display units (VDUs). In one embodiment, the system 100 also includes one or more data storage devices 116 connected to the data processing unit 102 to allow the processor 104 to store data in or retrieve data from internal or external storage media (not shown). Examples of typical data storage devices 116 include drives that accept hard and floppy disks, CD-ROMs (compact disk read-only memories), and tape cassettes.

It is observed that although the discussion given hereinbefore has been primarily with reference to memory devices, it is evident that the advantages of the present disclosure may be useful in other devices. Thus, the present disclosure is not to be limited to memory devices.

While the present disclosure has been described in connection with preferred embodiments thereof, those of ordinary skill in the art will recognize that many modifications and variations are possible. The present disclosure is intended to be limited only by the following claims and not by the foregoing description which is intended to set forth the presently preferred embodiment.

What is claimed is:

1. A delay locked loop, comprising:
   a forward delay line for receiving an input clock and for producing a synchronized output clock;
   an input/output model responsive to said output clock;
   a phase detector responsive to said input/output model and said input clock;
   a measure delay line responsive to said input/output model; and
   a shift register latch responsive to said measure delay line, said phase detector and responsive to first and second independent strobe signals for producing a lock point control signal input to said forward delay line.

2. The delay locked loop of claim 1 wherein said first strobe signal enables said shift register latch to receive new lock point data and wherein said second strobe signal causes said shift register latch to output a lock point control signal based on said new lock point data.

3. A method of operating a delay locked loop, comprising:
   producing a first output signal in response to a first lock point; and
   measuring a new lock point while continuing to produce said first output signal.

4. The method of claim 1 additionally comprising loading the new lock point into the delay locked loop while continuing to produce said first output signal.

5. The method of claim 4 additionally comprising moving from said first lock point to said new lock point.

6. The method of claim 5 wherein said moving is performed in response to one of a control signal, timer and environmental condition signal.

7. A method of setting a new lock point into an operating, register controlled, delay locked loop, comprising:
   while said delay locked loop is operating at a first lock point, identifying a new lock point;
   loading the new lock point into a least one register; and
   moving the new lock point to an output of said at least one register.

8. The method of claim 7 wherein said identifying includes measuring a new lock point.

9. The method of claim 7 wherein said moving is performed in response to one of a control signal, timer and environmental condition signal.

10. A method of setting a lock point into a register controlled, delay locked loop, comprising:
    inputting a first strobe signal to a plurality of registers to enable said plurality of registers to capture lock point data; and
    inputting a second strobe signal, independent of said first strobe signal, to said plurality of registers to enable said lock point data to be moved to respective outputs of said plurality of registers.

11. The method of claim 10 additionally comprising measuring lock point data.

12. A method of operating a delay locked loop of the type having registers for controlling the lock point of the loop, the improvement comprising allowing a signal based on an initial lock point to propagate through at least a portion of the delay locked loop while a measurement for a new lock point is determined.

13. A method of operating a delay locked loop of the type having registers for controlling the lock point of the loop, the improvement comprising holding a new lock point in the control registers while allowing a signal based on an old lock point to propagate through at least a portion of the delay locked loop.

14. The method of claim 13 wherein said new lock point is used in response to one of a control signal, timer and environmental condition signal.

15. A system, comprising:
a processor;
at least one memory device; and
a bus connecting said processor and said memory device, said memory device comprising:
 a array of memory cells;
 a plurality of peripheral devices for inputting data to and outputting data from said array of memory cells, said plurality of peripheral devices comprising a delay locked loop, comprising:
  a forward delay line for receiving an input clock and for producing a synchronized output clock;
  an input/output model responsive to said output clock;
  a phase detector responsive to said input/output model and said input clock;
  a measure delay line responsive to said input/output model; and
  a shift register latch responsive to said measure delay line, said phase detector and responsive to first and second strobe signals for producing a lock point control signal input to said forward delay line.

16. The system of claim 15 wherein said first strobe signal enables said shift register latch to input lock point data and wherein said second strobe signal causes said shift register latch to output said lock point control signal.

17. A memory device, comprising:
a array of memory cells;
a plurality of peripheral devices for inputting data to and outputting data from said array of memory cells, said plurality of peripheral devices comprising a delay locked loop, comprising:
 a forward delay line for receiving an input clock and for producing a synchronized output clock;
 an input/output model responsive to said output clock;
 a phase detector responsive to said input/output model and said input clock;
 a measure delay line responsive to said input/output model; and
 a shift register latch responsive to said measure delay line, said phase detector and responsive to first and second strobe signals for producing a lock point control signal input to said forward delay line.

18. The memory device of claim 17 wherein said first strobe signal enables said shift register latch to input lock point data and wherein said second strobe signal causes said shift register latch to output said lock point control signal.

* * * * *

UNITED STATES PATENT AND TRADEMARK OFFICE
CERTIFICATE OF CORRECTION

| | |
|---|---|
| PATENT NO. | : 7,212,053 B2 |
| APPLICATION NO. | : 11/127456 |
| DATED | : May 1, 2007 |
| INVENTOR(S) | : Tyler Gomm and Greg Blodgett |

It is certified that error appears in the above-identified patent and that said Letters Patent is hereby corrected as shown below:

Column 7, Line 21, delete "a" and substitute therefore --an--.

Column 8, Line 10, delete "a" and substitute therefore --an--.

Signed and Sealed this

Thirty-first Day of July, 2007

JON W. DUDAS
*Director of the United States Patent and Trademark Office*